(12) United States Patent  (10) Patent No.: US 6,618,022 B2
Harvey  (45) Date of Patent: Sep. 9, 2003

(54) RADIO FREQUENCY POWERED SWITCH

(75) Inventor: Arthur James Harvey, Mantua, OH (US)

(73) Assignee: Delta Systems, Inc., Streetsboro, OH (US)

( * ) Notice: Subject to any disclaimer, the term of this patent is extended or adjusted under 35 U.S.C. 154(b) by 0 days.

(21) Appl. No.: 10/128,052

(22) Filed: Apr. 22, 2002

(65) Prior Publication Data

US 2003/0016136 A1 Jan. 23, 2003

Related U.S. Application Data

(60) Provisional application No. 60/306,662, filed on Jul. 20, 2001.

(51) Int. Cl.[7] .............................................. H01Q 3/24
(52) U.S. Cl. .......................... 343/876; 343/841; 200/5; 340/572.7
(58) Field of Search ................................. 343/745, 749, 343/741, 841, 876; 200/5; 235/462, 472; 335/6, 16 R, 16 F; 315/149, 312; 340/572.7, 825.34

(56) References Cited

U.S. PATENT DOCUMENTS

| 3,634,636 | A |   | 1/1972 | Lyon ....................... 200/61.03 |
| 4,021,630 | A | * | 5/1977 | Taylor ......................... 200/612 |
| 4,318,266 | A |   | 3/1982 | Taube .......................... 56/10.2 |
| 4,851,801 | A |   | 7/1989 | Engel .......................... 335/230 |
| 4,964,265 | A |   | 10/1990 | Young ......................... 56/108 |
| 5,065,125 | A |   | 11/1991 | Thomson et al. ............... 335/5 |
| 5,365,027 | A |   | 11/1994 | Marvet et al. ............ 200/16 D |
| 5,438,817 | A |   | 8/1995 | Nakamura ................ 56/10.2 A |
| 5,524,368 | A |   | 6/1996 | Struck et al. .................. 37/235 |
| 5,551,524 | A |   | 9/1996 | Yamamoto et al. ........ 180/6.62 |
| 5,557,079 | A |   | 9/1996 | Jackson et al. ............. 200/5 A |
| 5,572,856 | A |   | 11/1996 | Ku ........................... 56/10.2 A |
| 5,666,792 | A |   | 9/1997 | Mullins .................... 56/10.2 A |
| 5,805,057 | A |   | 9/1998 | Eslaminovin ............... 340/426 |
| 5,974,347 | A |   | 10/1999 | Nelson ......................... 701/22 |
| 6,009,358 | A |   | 12/1999 | Angott et al. ................. 701/25 |
| 6,049,745 | A |   | 4/2000 | Douglas et al. ............... 701/23 |
| 6,104,281 | A |   | 8/2000 | Heinrich et al. ........... 340/10.5 |
| 6,112,152 | A |   | 8/2000 | Tuttle ......................... 701/115 |
| 6,412,813 | B1 | * | 7/2002 | Breed et al. ................ 280/735 |

OTHER PUBLICATIONS 11 page description of MCRF 202, Microchip Technology Inc. (2000), pp. 2–12.
1 page description of MCRF 450/451/452/455, Microchip Technology Inc. (2001), p. 32.
International Search Report, Application No. PCT/US02/21959, mailed Dec. 11, 2002.

* cited by examiner

*Primary Examiner*—Tan Ho
(74) *Attorney, Agent, or Firm*—Watts, Hoffman, Fisher & Heinke Co., L.P.A.

(57) ABSTRACT

A self contained radio frequency identification integrated circuit (RFIDIC) switch. The RFIDIC switch includes a switch housing, a radio frequency identification integrated circuit enclosed in the switch housing and an actuator extending into the switch housing. The RFIDIC is powered by a radio frequency carrier signal. The actuator is movable to a first position and to a second position. The radio frequency identification integrated circuit transmits a signal when said actuator is in one of the positions. Movement of the actuator to the other position alters said signal.

69 Claims, 9 Drawing Sheets

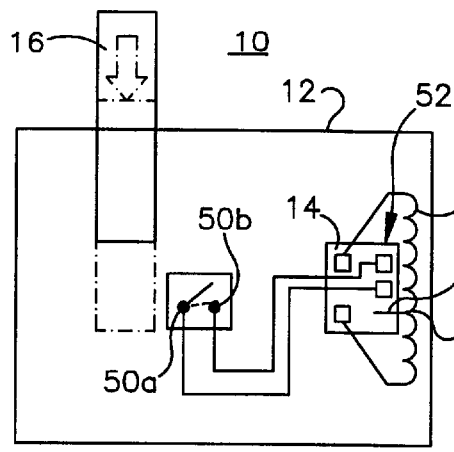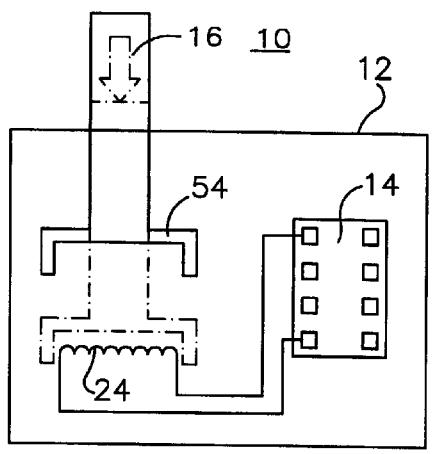
Fig.6  Fig.7
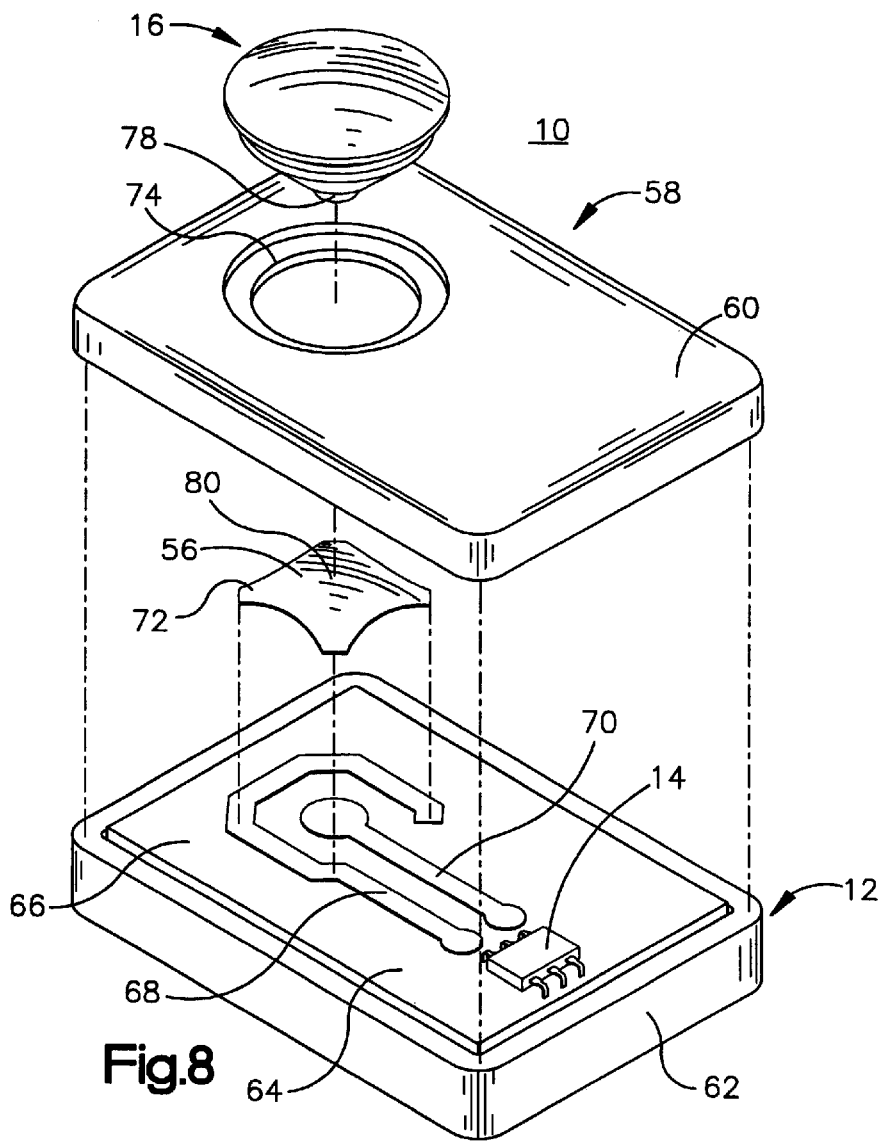
Fig.8

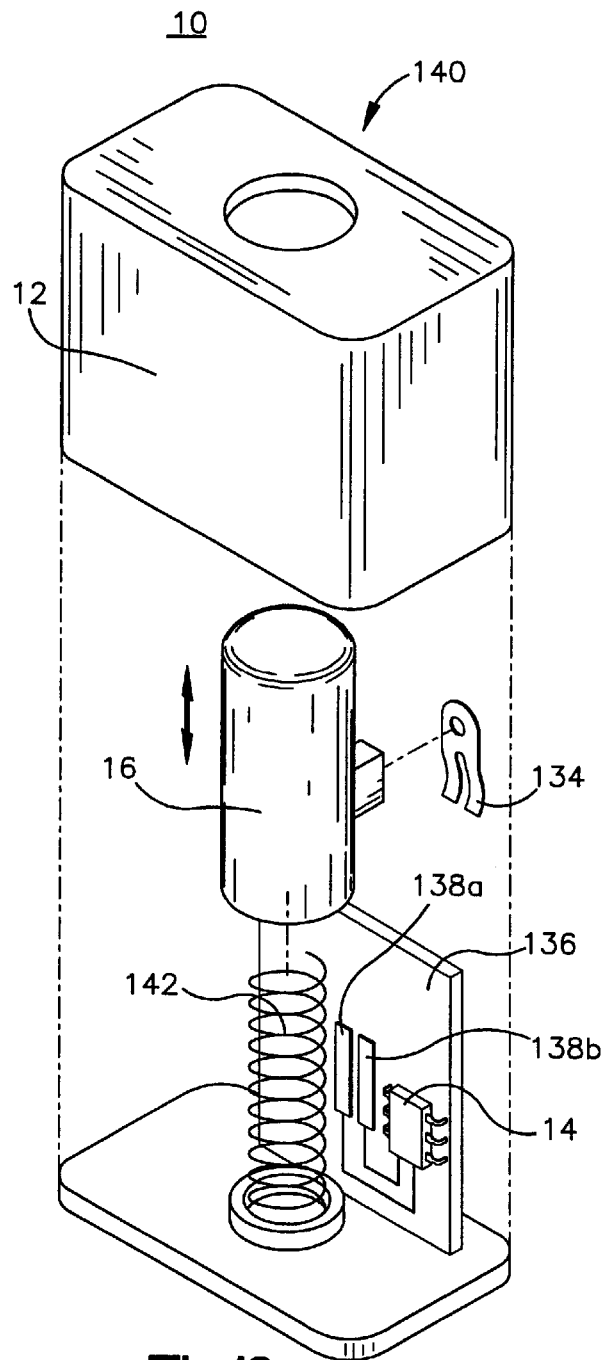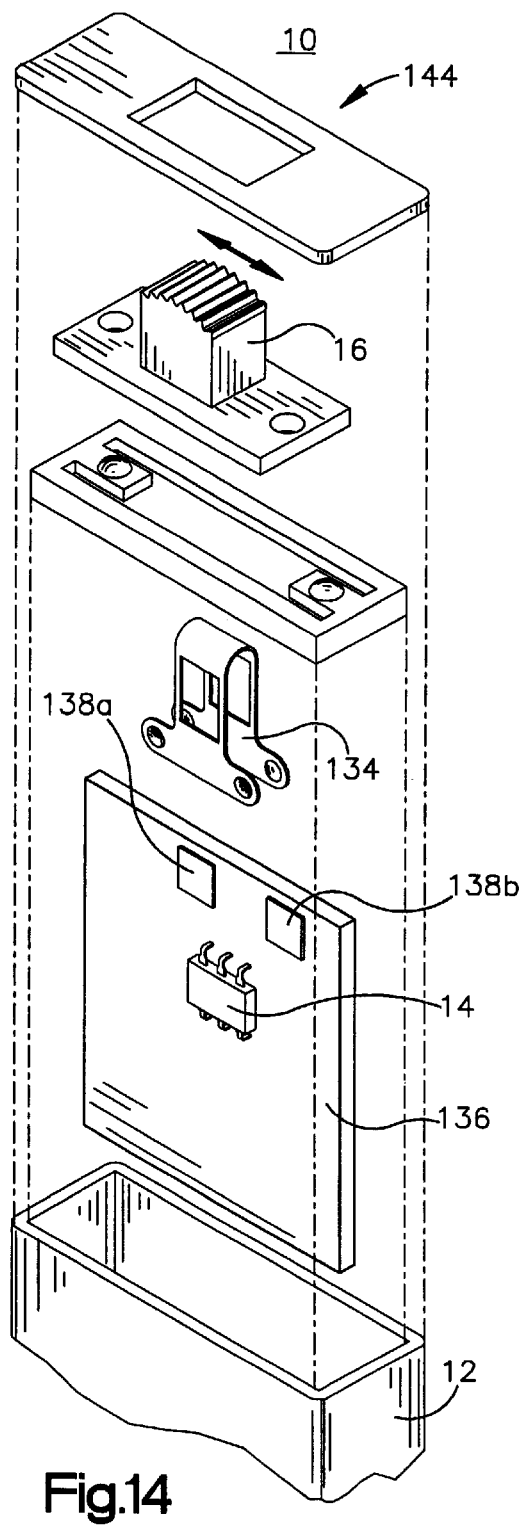
Fig.13
Fig.14

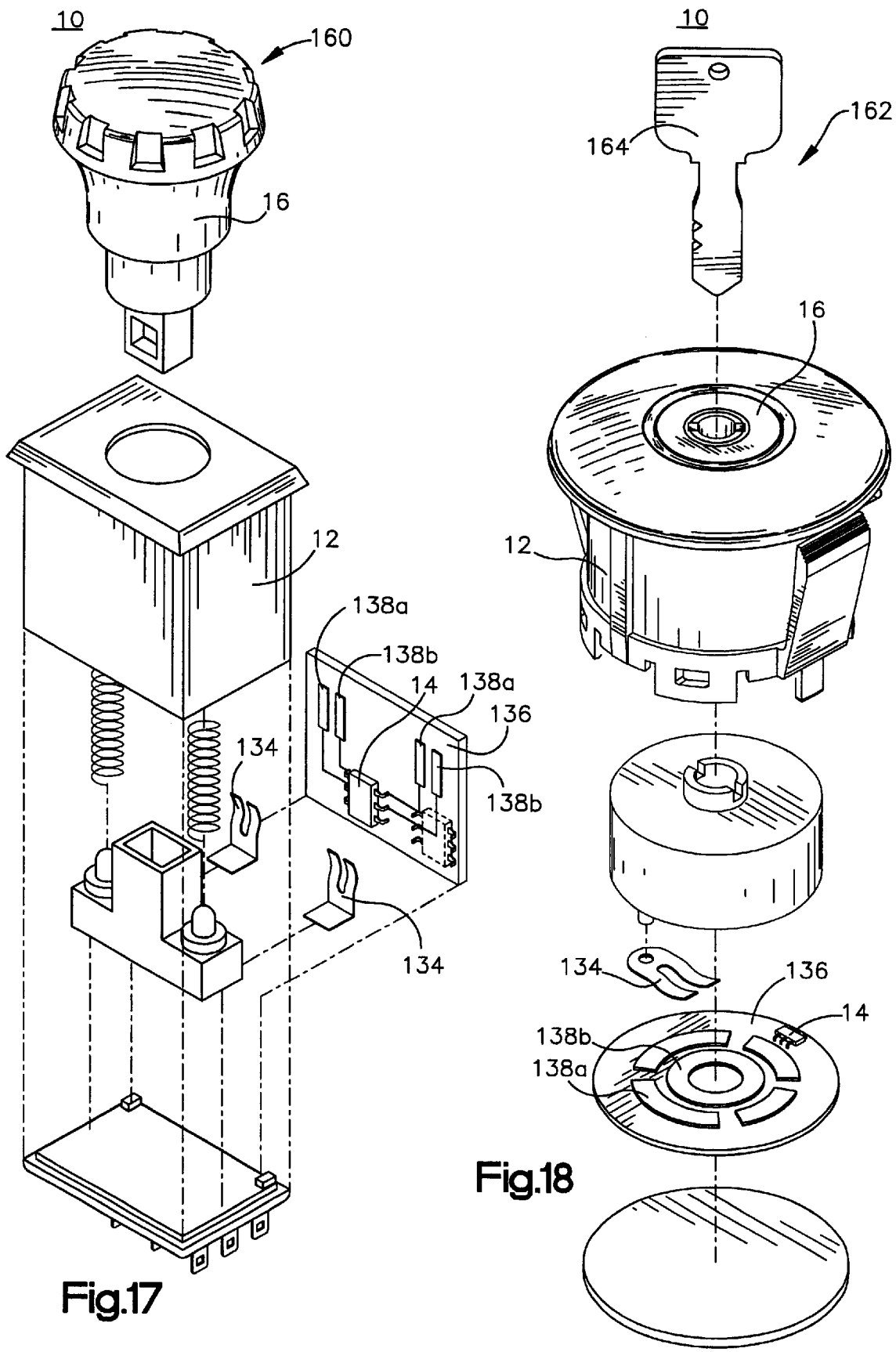

RADIO FREQUENCY POWERED SWITCH

This application claims the benefit of Provisional application No. 60/306,662 filed Jul. 20, 2001.

FIELD OF THE INVENTION

This disclosure relates in general to electrical switches and, more specifically, to a remote switching system using a radio frequency identification signal to convey a switch state.

BACKGROUND OF THE INVENTION

Conventional switches are generally connected to electrically controlled devices by two or more insulated wires. Many devices including lights, motors, engines, vehicle safety systems, lawn and garden shutdown systems, fans, heaters, controllers, and numerous other devices are controlled by conventional switches. The wires connected to the switches typically carry the electricity that drives an electrical device or carries a switching signal that controls the device.

The wires that power lights in a building are routed to the switch and to the light. The additional length of the wires that are routed to the switch adds to the cost of the building. The wires are extended through walls, requiring holes through studs, and threading the wires through the holes.

In control systems for vehicles, such as automobiles, boats, tractors, and lawn and garden equipment, wires are routed from control switches and sensing switches to the device being controlled. The wiring harnesses used in vehicles account for a significant portion of the cost of the vehicle.

Small battery powered remote controls using radio frequency signals or infrared signals to control devices have been developed. These devices are commonly used to control audio and video entertainment equipment, garage door openers and doorbells. One drawback to battery powered remote controls is that the battery's charge eventually runs out. Battery powered remote controls are not suitable for many applications, because a drained battery can be very inconvenient and even unsafe.

U.S. Pat. No. 5,163,112 to Lefevre et al. discloses a remote switch system for controlling electrical devices using an optical fiber to communicate the controlling signal from the remote switch to the device. Although the switch disclosed by the Lefevre et al. patent uses only one small optical fiber rather than two or more wires, the fiber optic fiber still has to be routed from the switch to the device being controlled.

There is a need for an improved system for switching electrically controlled devices that does not require a physical connection between the switch and the device, does not require a physical connection to a power source and does not require batteries.

DISCLOSURE OF THE INVENTION

The present invention concerns a self-contained radio frequency powered switch. The radio frequency powered switch includes a switch housing, a radio frequency powered circuit and a switch actuator. The radio frequency powered circuit is enclosed within the switch housing. The actuator extends into the switch housing and is movable between a first and a second position. The radio frequency powered circuit transmits a signal when the actuator is in the first or second position. Movement of the switch actuator to the other position alters the signal transmitted by the radio frequency identification integrated circuit. In one embodiment, the radio frequency powered circuit is a radio frequency identification integrated circuit (RFIDIC).

In one embodiment, an antenna is connected to the radio frequency identification integrated circuit. Movement of the actuator alters an electrical connection between the antenna and the radio frequency integrated circuit to alter the signal. A variety of mechanisms may be employed to alter the connection between the antenna and the radio frequency identification integrated circuit to alter the signal provided by the RFID switch. The antenna may be detuned by shorting antenna detuning leads. The ability of the radio frequency identification integrated circuit to detune the antenna may be disabled by opening the detuning lead from the radio frequency identification integrated circuit to the antenna. The antenna may be shorted to disable the power to the integrated circuit and the ability of the integrated circuit to communicate. The lead from the antenna to the integrated circuit may be opened to disable the integrated circuit power supply and the ability of the chip to communicate. A switch input to the integrated circuit may be provided that causes the integrated circuit to communicate a different value to the reader.

In one embodiment, the antenna is selectively shielded. Selectively shielding the antenna allows the signal to be provided when the actuator is in one position. The signal is blocked when the actuator is in a second position.

A variety of mechanisms may be employed for communicating the position of the actuator to the RFID integrated circuit or antenna. For example, a magnetic field may be employed to open and close connections to leads of the radio frequency identification integrated circuit. A reed switch or a hall switch may be coupled to leads of the integrated circuit. Movement of the actuator with respect to the reed switch or a hall switch alters the magnetic field at the reed switch or hall switch to open or close a connection to an input to the integrated circuit.

Traditional contacts may also be used to open and close inputs to the integrated circuit and/or the antenna. For example, a dome contact, wiping contact, point contact or leaf contact may be employed to open or close connections to the integrated circuit and/or the antenna.

A variety of switch types may be constructed as radio frequency identification integrated circuit switches. Examples of switches that can be constructed using the radio frequency identification integrated circuit switch design include rocker switches, push button switches, toggle switches, rotary switches, slide switches, tact switches, trigger switches, thumbwheel switches, push/pull switches, limit switches, lever switches, and conventional wall switches.

In use, the actuator is moved to one of the first position and the second position. In at least one of the positions, the radio frequency identification integrated circuit transmits a signal. The actuator is moved to the other position to alter the signal.

In one embodiment, the radio frequency identification switch is used in a radio frequency identification control system. The control system includes an oscillator, an RFID switch, and a data detection circuit. The oscillator produces a radio frequency carrier signal that powers the radio frequency identification integrated circuit of the RFID switch. The data signal detection circuit detects the data signal transmitted by the RFID switch and provides an output that is indicative of a position of the switch actuator. The output from the data signal detection circuit may be used to control virtually any device that is controlled by a conventional switch.

When the radio frequency identification control system is used, a radio frequency carrier signal is produced. The carrier signal is received by the radio frequency identification integrated circuit that is enclosed in the switch housing. The carrier signal powers the radio frequency identification integrated circuit. In one position, a data signal is transmitted with the radio frequency identification integrated circuit. When the actuator of the RFID switch is moved to the other position, the signal is altered. The data signal is received by the data signal detection circuit. The data signal detection circuit provides an indication of the position of the actuator.

Additional features of the invention will become apparent and a fuller understanding will be obtained by reading the following detailed description in connection with the accompanying drawings.

BRIEF DESCRIPTION OF DRAWINGS

FIG. 6 is a schematic representation of a RFIDIC switch selectively changing an input to the radio frequency identification integrated circuit;

FIG. 7 is a schematic representation of an RFIDIC switch selectively shielding an antenna;

FIG. 8 is an exploded perspective view of a tactile RFIDIC switch;

FIG. 13 is an exploded perspective view of a RFIDIC plunger switch;

FIG. 14 is an exploded perspective view of a RFIDIC slide switch;

FIG. 17 is an exploded perspective view of a RFIDIC push/pull switch;

FIG. 18 is an exploded perspective view of a RFIDIC rotary switch;

BEST MODE FOR CARRYING OUT THE INVENTION

Figure 1:
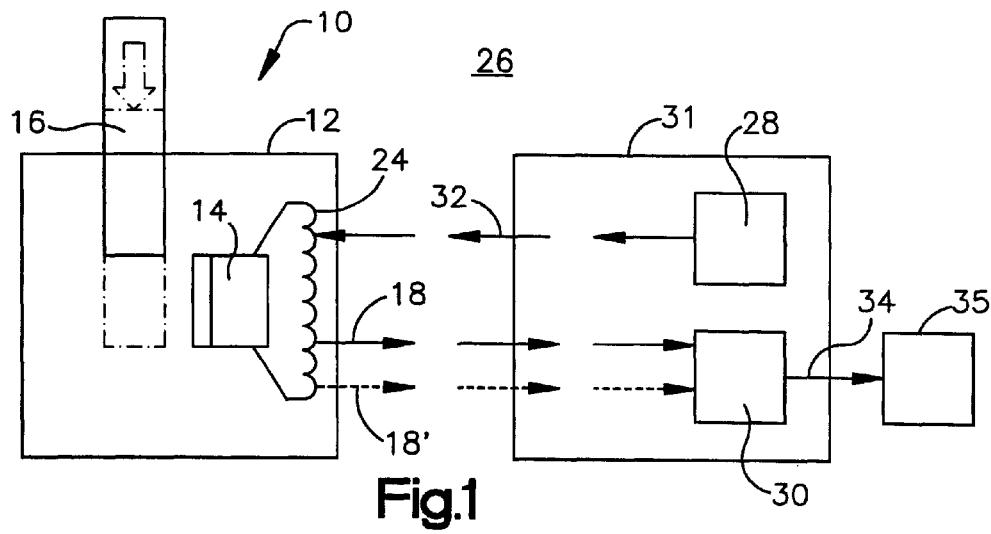
FIG. 1 a schematic representation of (a radio frequency identification) RFID control system.

The present invention is directed to a self contained radio frequency identification integrated circuit (RFIDIC) switch 10. The RFIDIC switch 10 includes a switch housing 12, a radio frequency identification integrated circuit (RFIDIC) 14 mounted in the housing and an actuator 16 that extends into the switch housing 12. The actuator 16 is movable from a first position to one or more additional positions. The RFIDIC 14 transmits a signal 18 when the actuator is in the first position or the second position. Movement of the actuator 16 to the other of the first or second positions alters the signal transmitted by the RFIDIC 14. An altered signal 18' is illustrated in FIG. 1. However, the signal may be altered by eliminating the signal or by blocking or shielding the signal. The altered signal 18' is meant to represent a signal that is different than the signal 18, as well as the absence of the signal 18.

Referring to FIG. 1, in the illustrated embodiment an antenna 24 is coupled to the RFIDIC 14. In one embodiment, the RFIDIC switch 10 is used in a radio frequency identification control system 26. The RFIDIC control system 26 includes an oscillator 28, a self contained RFIDIC switch 10 and a data signal detection circuit 30. In the exemplary embodiment, the oscillator 28 and the detection circuit are packaged together in a housing 31.

The oscillator 28 produces a radio frequency carrier signal 32. In the illustrated embodiment, the radio frequency carrier signal 32 is received by the antenna 24 coupled to the RFIDIC 14. The RFIDIC 14 is powered by the radio frequency carrier signal 32 from the oscillator 28. The RFIDIC switch 10 transmits a signal 18 to the data signal detection circuit 30 when the actuator 16 of the RFIDIC switch 10 is in a first position. The signal 18 provided by the RFIDIC switch 10 through the antenna 24 to the data signal detection circuit 30 is altered when the actuator 16 is moved from the first position (depicted in solid lines). The data signal detection circuit 30 detects the signal 18 transmitted by the RFIDIC 14 and provides an output 34 that is indicative of the position of the RFIDIC switch actuator 16. The output 34 from the data signal detection circuit 30 may be used to control an implement 35 that is traditionally controlled by a hard wired switch.

The output 34 from the data detection circuit 30 may be used to control more than one implement. For example, the out put 34 may be used to open a connection to one implement and close a connection to a second implement. When a traditional switch was used in this situation, a double pole switch having a pair of normally closed terminals and a pair of normally open terminals was required. The first implement was hardwired to the normally closed terminals and the second implement was hardwired to the normally open terminals. Only one signal 18 from the self contained RFIDIC switch is required to control the first and second implements. The signal 18 that represents the position of the switch actuator is provided to the data detection circuit 30. The output 34 from the data detection is used to open a connection to one implement and close a connection to a second implement.

For example, in a lawn and garden tractor a two pole switch is typically coupled to the brakes of the tractor. One pole ensures that it is safe to start the tractor and the second pole ensures that the tractor is safely operated. The traditional double pole switch can be replaced with an RFIDIC switch that provides a signal to the controller that is indicative of the position of the RFIDIC switch. The controller provides outputs that ensure starting and operation of the lawn and garden tractor are safe based on the sensed position of the RFIDIC switch.

The signal 18 from the RFIDIC 14 can be altered in many ways. For example, movement of the actuator 16 can cause the RFIDIC 14 to transmit a second signal or prevent the RFIDIC 14 from transmitting a signal. Many mechanisms can be employed to cause the RFIDIC 14 to alter the signal 18 it transmits.

Figure 2:
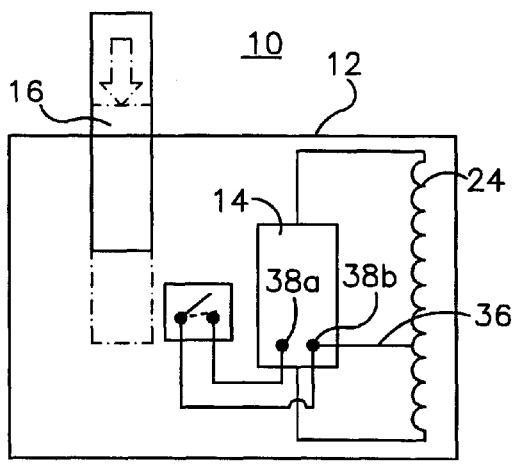
FIG. 2 is a schematic representation of a radio frequency identification integrated circuit (RFIDIC) switch selectively shorting a detuning lead.

Referring to FIG. 2, a detuning lead 36 connects the RFIDIC 14 to an intermediate location 37 of and the antenna 24. The detuning lead 36 is shown external to the RFIDIC 14 for illustrative purposes. However, the detuning lead 36 is typically internal to the RFIDIC and the intermediate location 37 is connected to the RFIDIC. The RFIDIC 14 periodically couples and decouples the detuning lead 36 to the antenna 24 to cause the antenna 24 to transmit a signal having a given amplitude. In this embodiment, the frequency of the signal from the antenna remains constant and the amplitude changes at a rate at which the RFIDIC 14 couples and decouples the detuning lead 36 to the antenna 24.

FIG. 2 illustrates an RFIDIC switch 10 that selectively shorts the detuning lead 36 to prevent the RFIDIC 14 from detuning the antenna 24 to alter the signal 18 provided by the RFIDIC switch 10. In the illustrated embodiment, contacts 38a, 38b are open when the actuator 16 is in the first position (shown in solid lines). In this position, the RFIDIC antenna provides a first signal 18 having a varying amplitude. When the actuator 16 is in the second position (shown in phantom) the contacts 38a, 38b are closed to short the detuning lead 36. When the detuning lead 36 is shorted, the RFIDIC 14 produces a signal 18' having a constant amplitude, since the RFIDIC cannot vary the signal's amplitude. As a result, the signal is provided by the RFIDIC is not detected by the data detection circuit when the detuning lead is shorted, allowing the data detection circuit to determine that the signal has been altered. In summary, movement of the actuator 16 from the first position to the second position shorts the detuning lead 36 of the RFIDIC 14 to alter the signal 18 by eliminating the signal sensed by the data detection circuit.

Figure 3:
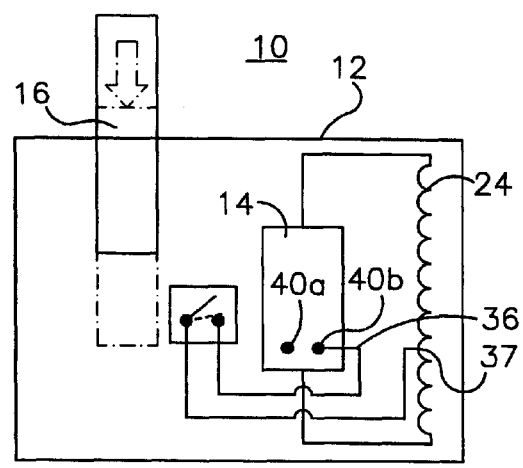
FIG. 3 is a schematic representation of a RFIDIC switch selectively opening a connection between a detuning lead and an antenna.

FIG. 3 illustrates an RFIDIC switch 10, wherein movement of the actuator 16 opens the detuning lead 36 to alter the signal 18. When the actuator 16 is in the position shown in phantom, contacts 40a, 40b are closed. In this position, the RFIDIC 14 periodically detunes the antenna 24 to produce a signal 18 having a varying amplitude. When the actuator 16 is in the position shown in solid lines, the contacts 40a, 40b are opened to open the detuning lead 36. The RFIDIC 14 is prevented from detuning the antenna 24 when the contacts 40a, 40b are opened. As a result, the signal 18 provided by the RFIDIC 14 is fixed in amplitude when the actuator is moved to the position shown in solid lines.

Figure 4:
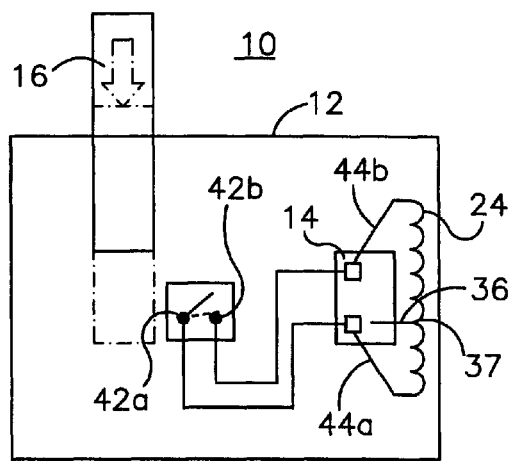
FIG. 4 is a schematic representation of a RFIDIC switch selectively shorting an antenna.

FIG. 4 illustrates an RFIDIC switch 10 that alters the signal provided by the RFIDIC 14 by shorting the antenna 24 when the actuator 16 is moved to one of the first or second positions. Contacts 42a, 42b are connected to leads 44a, 44b of the antenna 24. When the actuator 16 is in the position shown in solid lines, the contacts 42a, 42b are open. When the contacts 42a, 42b are open, the RFIDIC 14 transmits a signal 18 through the antenna 24 at a given frequency. When the actuator 16 is moved to the position shown in phantom, the contacts 42a, 42b are closed to short the antenna 24. When the antenna 24 is shorted, the RFIDIC 14 is prevented from providing a signal through the antenna 24. In addition, the RFIDIC 14 is prevented from receiving the radio frequency carrier signal 32 from the oscillator 28 that powers the RFIDIC 14. As a result, the signal 18 provided by the RFIDIC 14 is removed when the actuator 16 is moved to short the antenna 24 of the RFIDIC 14.

Figure 5:
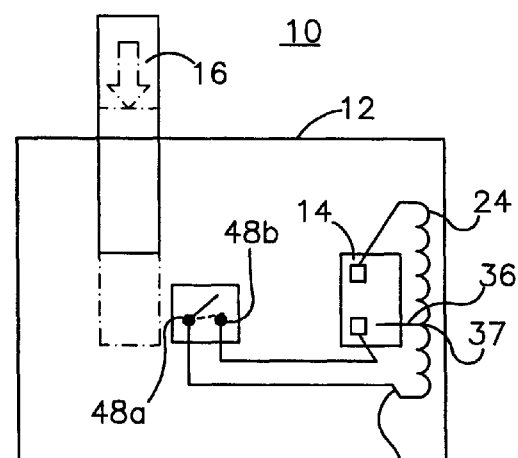
FIG. 5 is a schematic representation of RFIDIC switch selectively opening a connection between an integrated circuit and an antenna.

FIG. 5 illustrates an RFIDIC switch 10, wherein movement of the actuator 16 selectively opens a lead 46 from an antenna 24 to the RFIDIC 14. A pair of contacts 48a, 48b are interposed in the lead 46 from the RFIDIC 14 to the antenna 24. When the actuator 16 is in the position shown in phantom, the RFIDIC 14 is connected to the antenna 24 and the RFIDIC 14 can receive the carrier signal 32 from the oscillator 28 and transmit a signal 18 through the antenna 24. When the actuator 16 is in the position shown by solid lines, the contacts 48a, 48b are opened to disconnect the lead 46 of the antenna 24 from the RFIDIC 14. When the lead 46 is disconnected from the RFIDIC 14, the RFIDIC 14 cannot transmit a signal through the antenna 24 and cannot receive the radio frequency carrier signal 32 from the oscillator 28 to power the RFIDIC 14. The signal 18 is altered by moving the actuator 16 to open the lead 46 from the RFIDIC 14 to the antenna 24.

FIG. 6 illustrates an RFIDIC switch 10, wherein movement of the actuator 16 causes the RFIDIC 14 to transmit a second signal. When the actuator 16 is in the position shown in solid lines, contacts 50a, 50b that are connected to an input 52 to the RFIDIC 14 are open. In this position, the RFIDIC 14 transmits a first signal 18 through the antenna 24. When the actuator 16 is in the position shown in phantom the contacts 50a, 50b are closed to close the input 52 to the RFIDIC 14. In this position, the RFIDIC 14 transmits a second signal 18' that is indicative of the position of the actuator 16. The RFIDIC 14 may be configured to provide multiple signals in response to multiple positions of the actuator 16.

FIG. 7 illustrates an RFIDIC switch 10 that alters the signal 18 by selectively shielding the antenna 24. In the illustrated embodiment, a shield 54 is mounted to the actuator 16. When the actuator 16 is in the position shown in solid lines, the shield 54 is spaced apart from the antenna 24. In this position, the antenna 24 of the RFIDIC 14 can receive the carrier signal 32 from the oscillator 28 and can transmit a signal 18 to the data signal detection circuit 30. When the actuator 16 is in the position shown in phantom, the shield 54 blocks the antenna 24. In this position, the carrier signal 32 is blocked by the shield 54 and the signal 18 from the RFIDIC 14 is blocked by the shield 54. As a result, the signal 18 provided by the antenna 24 does not reach the data signal detection circuit 30. In addition, the RFIDIC 14 quickly loses power since the carrier signal 32 does not reach the antenna 24.

The mechanisms illustrated by FIGS. 2–7 for altering the signal transmitted by the RFIDIC 14 can be combined to construct an RFIDIC switch 10 that provides an indication of more than two positions of the actuator 16. For example, the mechanism for shorting the antenna 24 illustrated by FIG. 4, could be combined with the mechanism for providing an input to the RFIDIC 14 that causes the RFIDIC 14 to transmit a second signal (FIG. 6) to construct an RFIDIC switch 10 that transmits a first signal when the actuator 16 is in a first position, a second signal when the actuator 16 is in a second position, and no signal when the actuator 16 is in a third position. In the first position, the contacts 42a, 42b that selectively short the antenna 24 would be open and the contacts 50a, 50b that provide an input to the RFIDIC 14 would be open, causing the RFIDIC 14 to transmit a first signal. In the second position, the contacts 42a, 42b that selectively short the antenna 24 are still open and the contacts 50a, 50b that provide an input to the RFIDIC 14 are closed, causing the RFIDIC 14 to transmit a second signal. In the third position the contacts 42a, 42b are closed to short the antenna 24 so that the RFIDIC 14 cannot transmit any signal.

Similarly, the mechanism illustrated by FIG. 6 can be combined with the shielding mechanism illustrated by FIG. 7 to construct an RFIDIC switch 10 that conveys three or more positions of the actuator 16. For example, in a first position the contacts 50a, 50b are open and the shield 54 does not prevent the carrier signal 32 from reaching the antenna 24 or block the signal 18 from the antenna 24 from reaching the detection circuit 30. In the second position, the contacts 50a, 50b are closed causing RFIDIC 14 to transmit a second signal and the shield 54 does not block the antenna 24 so that the carrier signal 32 can reach the antenna 24 and the signal from the antenna 24 can reach the detection circuit 30. In a third position, the shield 54 blocks the antenna 24 so that the carrier signal 32 does not reach the antenna 24 and the signal 18 from the RFIDIC 14 does not reach the detection circuit 30.

Many different mechanisms may be used to communicate the position of the actuator 16 to the RFIDIC 14, the antenna 24 and/or the detuning lead 36 to alter the signal 18 transmitted by the RFIDIC 14. In the illustrated embodiment, connections to the RFIDIC 14, antenna 24 and/or detuning lead 36 are selectively connected or disconnected to alter the signal 18 provided by the RFIDIC switch 10. A variety of switching mechanisms may be used to selectively open and close connections to the RFIDIC 14, the antenna 24 and/or the detuning lead 36 to alter the signal 18 provided by the RFIDIC switch 10. Examples of switching mechanisms include dome contacts, leaf contacts switches, wiping contacts, magnetically actuated devices, such as reed switches and hall effect sensors, wiping contacts, point contacts and leaf contacts.

FIG. 8 illustrates an RFIDIC switch 10 that utilizes a dome contact 56 to open or close a connection to the RFIDIC 14, the antenna 24 and/or the detuning lead 36 to alter the signal 18 transmitted by the RFIDIC 14. The switch illustrated by FIG. 8 is referred to as a tactile switch 58. The tactile switch 58 includes a housing 12 that includes an upper portion 60 and a lower portion 62. A printed circuit board 64 is mounted in the housing 12. An RFIDIC 14 is mounted to the printed circuit board 64. In the exemplary embodiment, the antenna 24 comprises traces (not shown) on the printed circuit board 64. The antenna 24 may be on the top side 66 and/or the bottom (not shown) of the printed circuit board 64. Traces 68, 70 on the printed circuit board 64 are connected to the RFIDIC 14, the antenna 24 and/or the detuning lead 36 as illustrated in FIGS. 2–6.

In the illustrated embodiment, the dome contact 56 is constrained in the switch housing 12, such that outer portions 72 or legs of the dome contact 56 are maintained in contact with the trace 68. The actuator 16 snaps into an opening 74 in the upper portion 60 of the housing 12. The illustrated actuator 16 for the tactile switch 58 is in the form of a button that snaps into the opening 74 in the upper portion 60 of the housing 12. The button includes a portion 78 that extends into the switch housing 12. When the button is undepressed, a middle portion 80 of the dome contact 56 is spaced apart from the trace 70. When the button 76 is depressed, the portion 78 that extends into the housing 12 engages the middle portion 80 of the dome contact 56 and brings the middle portion 80 into contact with the trace 70 to electrically connect traces 68, 70. A connection to the RFIDIC 14, antenna 24, and/or detuning lead 36 is closed by depressing the button to alter the signal provided by the RFIDIC 14 as shown in FIGS. 2–6.

FIGS. 9–12 illustrate RFIDIC switches that utilize magnetically actuated devices 82 to open or close a connection to the RFIDIC 14, the antenna 24, and/or the detuning lead 36 to alter the signal transmitted by the RFIDIC 14. Examples of magnetically actuated devices 82 include reed switches and hall effect sensors. A reed switch is a sealed unit that includes two spaced apart contacts. In the presence of a magnetic field, the two spaced apart contacts of the reed switch come into contact with one another to close the switch. A hall effect sensor provides a signal in the presence of a magnetic field. In the exemplary embodiment, the hall sensor is powered by the RFIDIC. In the exemplary embodiment, a transistor (not shown) included in the hall sensor or mounted to the printed circuit board is used in conjunction with the hall effect sensor to open or close a connection to the RFIDIC 14, the antenna 24, and/or the detuning lead 36.

Figure 9:
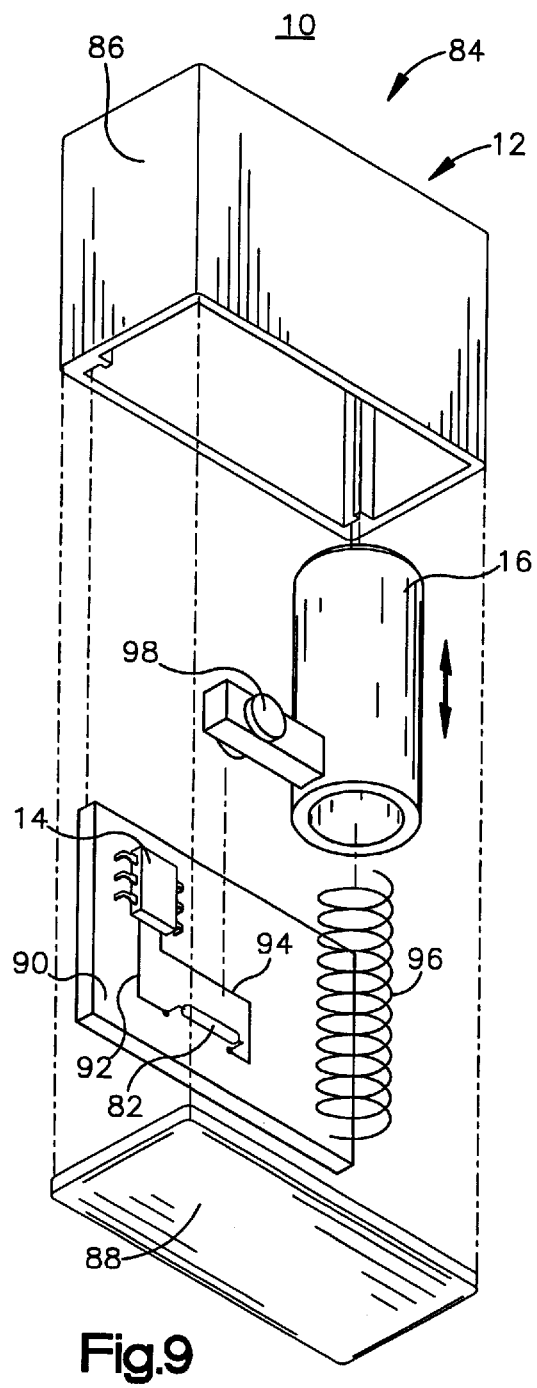
FIG. 9 is an exploded perspective view of a pushbutton RFIDIC switch.

FIG. 9 illustrates an RFIDIC switch 10 that utilizes a magnetically actuated device 82 to open or close a connection to the RFIDIC 14, the antenna 24, and/or the detuning lead 36 to alter a signal transmitted by the RFIDIC 14. The switch illustrated by FIG. 9 is a pushbutton switch 84 that utilizes a magnetically actuated device 82 to alter the signal provided by the RFIDIC 14. The pushbutton switch 84 includes a housing 12 that includes an upper portion 86 and a lower portion 88. A printed circuit board 90 is mounted in the housing 12. An RFIDIC 14 is mounted to the printed circuit board 90. In the exemplary embodiment, the antenna 24 comprises traces (not shown on the printed circuit board 90). Traces 92, 94 on the printed circuit board are connected to the magnetically actuated device 82 and the RFIDIC 14, the antenna 24 and/or the detuning lead 36. An actuator 16 is constrained in the switch housing 12 to movement along a path from an extended position to a depressed position. A spring 96 is constrained by the actuator 16 and the housing 12. Spring 96 biases the actuator 16 to an extended position. A magnet 98 is connected to the actuator 16. In a first position, the magnet 98 is spaced apart from the magnetically actuated device 82. In a second position, the magnet 98 is adjacent to the magnetically actuated device 82 such that a magnetic field of the magnet 98 actuates the magnetically actuated device 82. When the magnetically actuated device 82 is actuated, a connection to the RFIDIC 14, the antenna 24 and/or the detuning lead 36 is opened or closed to alter the signal transmitted by the RFIDIC 14.

Figure 10:
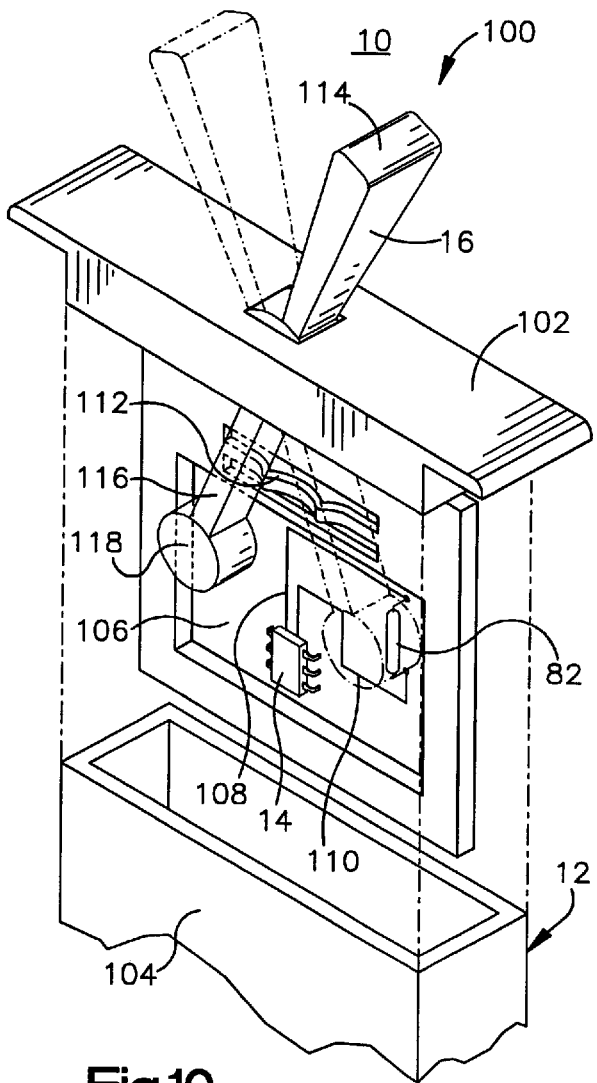
FIG. 10 is an exploded perspective view of a RFIDIC toggle switch.

FIG. 10 illustrates a toggle switch 100 that utilizes a magnetically actuated device 82 to open or close a connection to the RFIDIC 14, the antenna 24 and/or the detuning lead 36 to alter the signal transmitted by the RFIDIC. The toggle switch 100 includes a housing 12 that has an upper portion 102 and a lower portion 104. A printed circuit board 106 is mounted in the housing 12. An RFIDIC 14 and a magnetically actuated device 82 are mounted to the printed circuit board 106. The antenna 24 comprises traces on the printed circuit board. Traces 108, 110 on the printed circuit board connect the magnetically actuated device 82 to the RFIDIC 14, the antenna 24 and/or the detuning lead 36. A maintaining member 112 is mounted in the switch housing 12. The maintaining member 112 maintains a toggle actuator 114 in selected positions. The illustrated maintaining member 112 maintains the toggle actuator 114 in a selected one of three positions. It should be readily apparent to those skilled in the art that the maintaining member 112 can be constructed to maintain the toggle actuator 114 at any number of positions. For example, the maintaining member 112 can be constructed to maintain the toggle actuator 114 at a first position (indicated by solid lines) where an internal portion 116 of the actuator is spaced apart from the magnetic actuated device 82 and a second position (shown in phantom) where the internal portion 116 of the toggle actuator 114 is adjacent to the magnetically actuated device 82. In the illustrated embodiment, a magnet 118 is connected to the internal portion 116 of the toggle actuator. When the toggle actuator 114 is in the position indicated by solid lines, the magnet 118 is spaced apart from the magnetically actuated device 82. When the toggle actuator 114 is in the position indicated in the phantom the magnet 118 is adjacent to the magnetically actuated device. In this position, a magnetic field from the magnet 118 actuates the magnetically actuated device 82, which causes the magnetically actuated device 82 to open or close a connection to the RFIDIC 14, the antenna 24 and/or the detuning lead 36.

Figure 11:
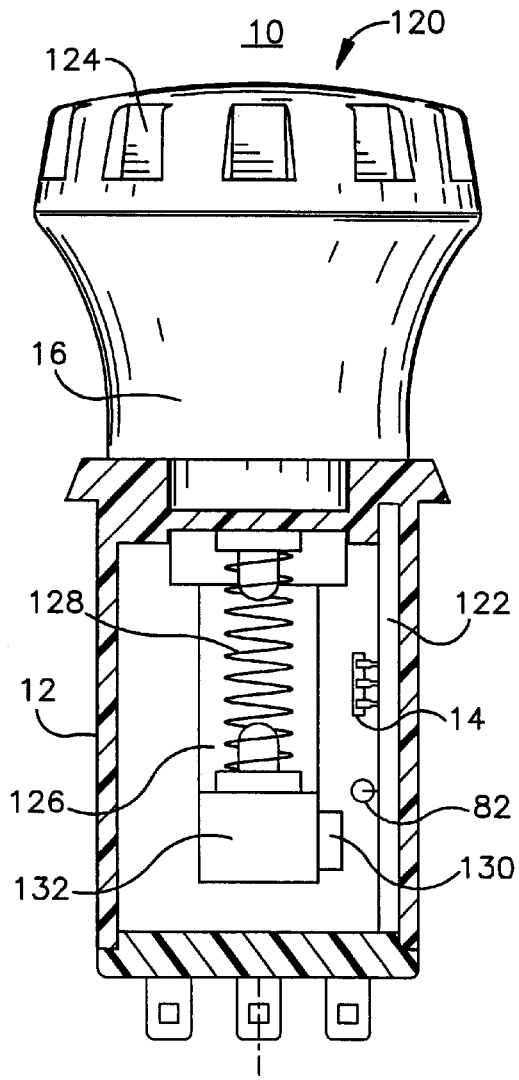
FIG. 11 is a side elevational view, partially in section, of a RFIDIC push/pull switch.
Figure 12:
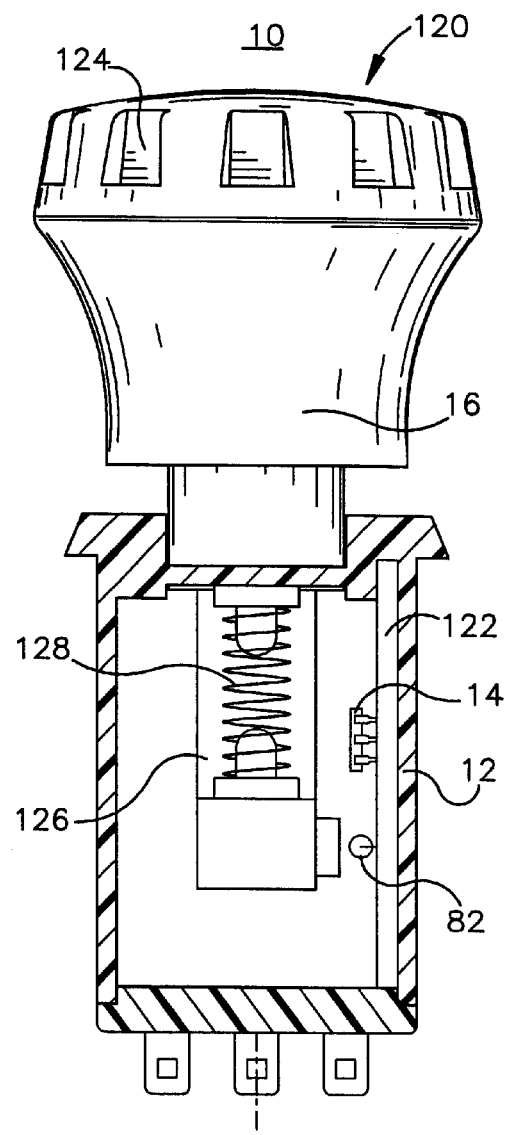
FIG. 12 is a side elevational view, partially in section, of a RFIDIC push/pull switch.

FIGS. 11 and 12 illustrate a push/pull RFIDIC switch 120 that utilizes a magnetically actuated device 82 coupled to the RFIDIC 14, antenna 24 and/or detuning lead 36 to alter the signal transmitted by the RFIDIC 14. A printed circuit board 122 is mounted in a housing 12 of the switch. An RFIDIC 14 and a magnetically actuated device 82 are mounted on the printed circuit board. The magnetically actuated device 82 is electrically connected to the RFIDIC 14, the antenna 24 and/or detuning lead 36. The actuator 16 of the push/pull switch 120 includes a knob 124 and an interior portion 126. In the illustrated embodiment, a spring 128 constrained by the housing 12 and the interior portion 126 of the actuator. The spring 128 biases the actuator 12 to a depressed position shown in FIG. 11 in the illustrated embodiment. In the illustrated embodiment, a magnet 130 connected to a distal end 132 of the actuator 16 is spaced apart from the magnetically actuated device 82 when the actuator 16 is in the position shown in FIG. 11. When the knob 124 of the actuator 16 is pulled to move the magnet 130 to the position shown in FIG. 12, the magnet 130 applies a magnetic field to the magnetically actuated device 82 to open or close a connection to the RFIDIC 14, the antenna 24 and/or detuning lead 36 to alter the signal 18 provided by the RFIDIC.

It should be readily apparent to those skilled in the art that the configurations of the magnets and the magnetically actuated devices shown in FIGS. 9–12 are for illustrative purposes only and the magnets and magnetically actuated devices may be configured differently than as shown and described. For example, the position of the actuator shown as positioning the magnet to apply a magnetic field to the magnetically actuated device could be changed to another position of the actuator 16 by repositioning the magnet or the magnetically actuated device. As a further example, a magnetic field enhancing or blocking member (not shown) could be coupled to the actuator 16 instead of a magnet. In this embodiment, the magnet would be mounted in the switch housing 12 spaced apart from the magnetically actuated device 82. Movement of the actuator would move the magnetic field enhancing or blocking member into or out of a region between the magnetically actuated device and the magnet to cause the magnetically actuated device to open or close contacts connected to the RFIDIC, the antenna and/or the detuning lead.

FIGS. 13–18 illustrate RFIDIC switches 10 that use wiping contacts 134 to open or close connections to an RFIDIC 14, an antenna 24 and/or a detuning lead 36 to alter a signal transmitted by the RFIDIC. The switches shown in FIGS. 13–18 each include wiping contacts 134 coupled to an actuator 16 for movement with the actuator. The RFIDIC 14 is mounted to a printed circuit board 136 that is mounted in a housing 12. A first trace 138a and a second trace 138b are defined on the printed circuit board 136. The traces 138a, 138b are electrically connected to the RFIDIC, the antenna and/or the detuning lead, such that selective opening or shorting of the traces 138a, 138b alters a signal provided by the RFIDIC. When the actuator 16 is in a first position, the wiping contact 134 engages the first and second traces 138a, 138b to electrically connect the traces. When the actuator 16 is in a second position, the wiping contact 134 is moved out of engagement with one or both of the traces 138a, 138b to disconnect them from one another and thereby alter the signal provided by the RFIDIC.

FIG. 13 illustrates an RFIDIC push button switch 140 that utilizes a wiping contact. The actuator 16 is biased to an extended position by a spring 142. The wiping contact 134 is coupled to the actuator 16. When the actuator 16 is in a first position the wiping contact 134 contacts the first and second traces 138a, 138b to electrically connect the traces to close a connection to the RFIDIC 14, an antenna 24 and/or a detuning lead 36. In a second position, the wiping contact 134 does not contact the traces 138a, 138b and a connection to the RFIDIC 14, antenna 24 and/or detuning lead 36 is open.

FIG. 14 illustrates a slide switch 144 that utilizes a wiping contact 134 to open and close a connection to the RFIDIC 14, antenna 24, and/or detuning lead 36. The wiping contact 134 is coupled to the actuator 16 that is moveable between first and second positions. In the first position, the wiping contact 134 contacts the traces 138a, 138b to close a connection to the RFIDIC 14, antenna 24, and/or detuning lead 36. In a second position, the wiping contact 134 does not contact one or more of the traces 138a, 138b. As a result, a connection to the RFIDIC 14, antenna 24 and/or detuning lead 36 is open.

Figure 15:
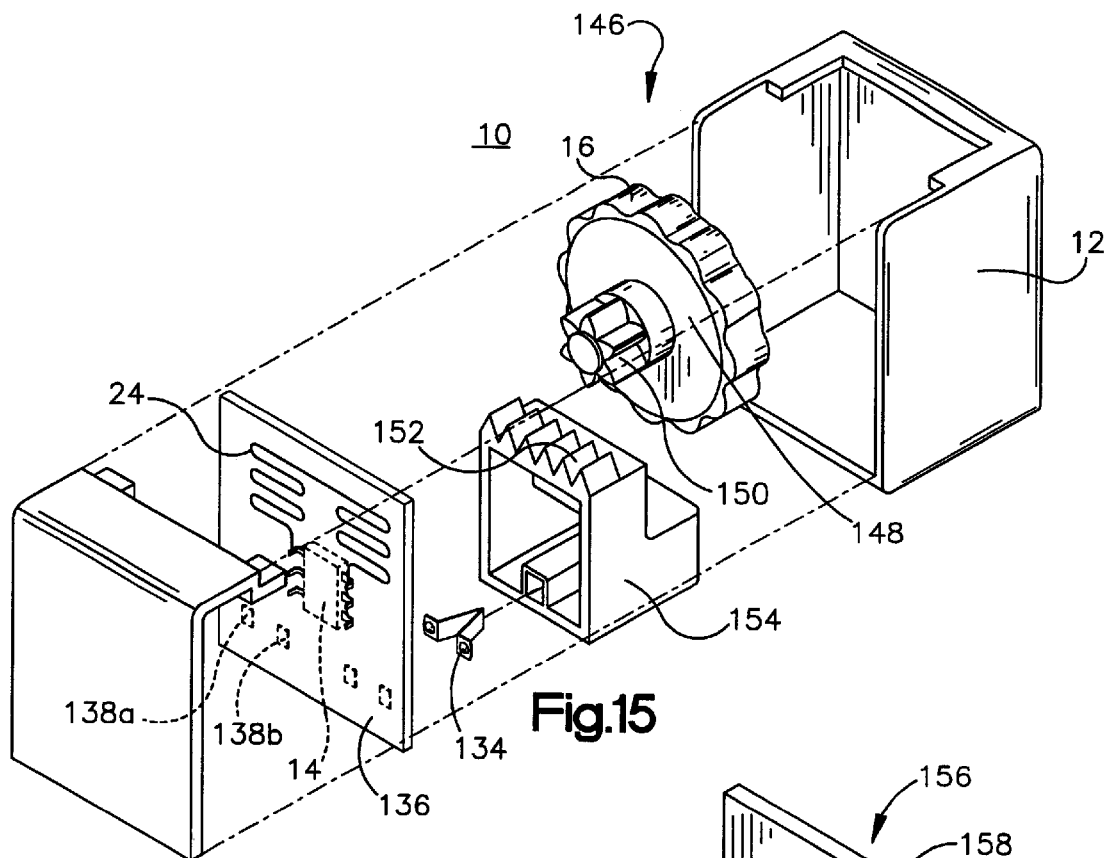
FIG. 15 is an exploded perspective view of a RFIDIC thumbwheel switch.

FIG. 15 illustrates a thumbwheel switch 146 that utilizes a wiping contact 134 to open or close a connection to the RFIDIC 14, antenna 24 and/or detuning lead 36. A thumbwheel 148 is rotatably mounted in the switch housing 12. The thumbwheel 148 includes a gear 150 that meshes with teeth 152 of a rack 154. Rotation of the thumbwheel 148 causes the rack 154 to move between first and second positions. A wiping contact 134 is coupled to the rack 154. In the first position, the wiping contact 134 engages traces 138a, 138b to close a connection to the RFIDIC 14, antenna 24 and/or detuning lead 36. In the second position, the wiping contact 134 does not touch one ore more of the traces 138a, 138b. As a result, a connection to the RFIDIC 14, antenna 24 and/or detuning lead 36 is open.

Figure 16:
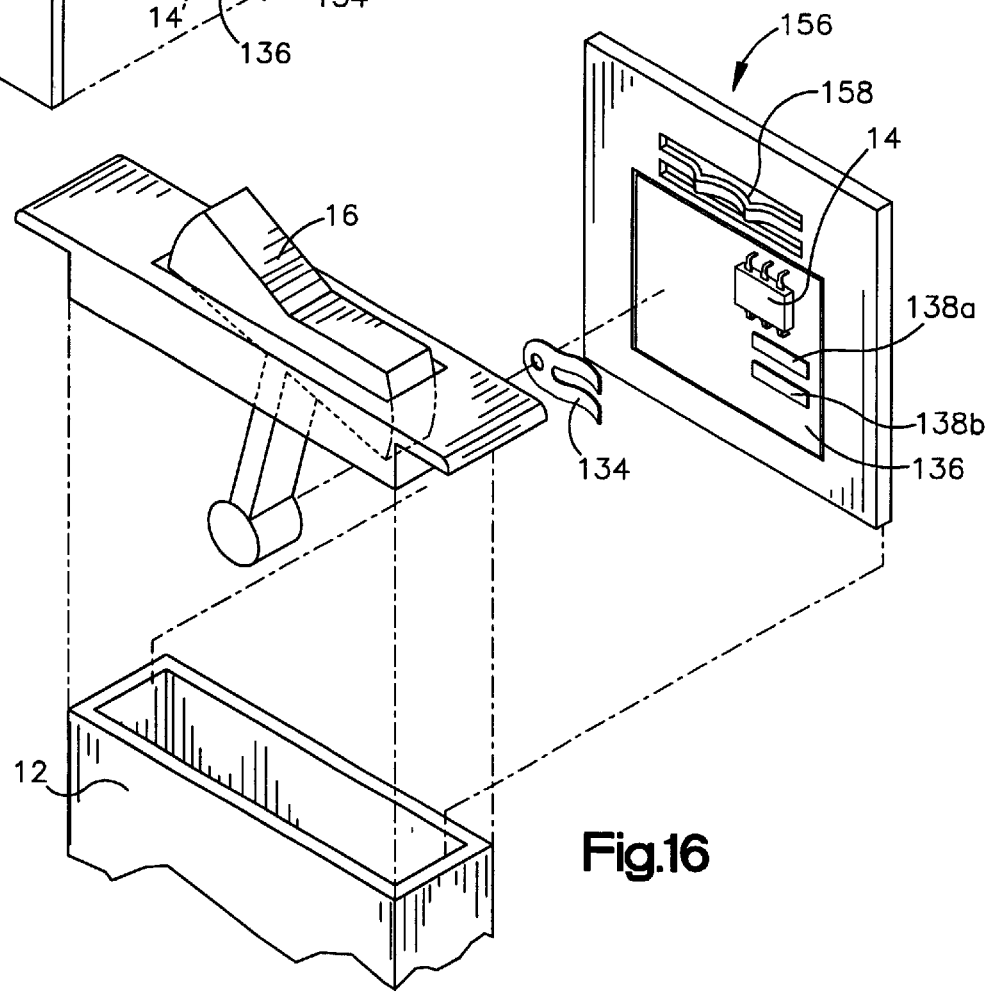
FIG. 16 is an exploded perspective view of a RFIDIC rocker switch.

FIG. 16 illustrates an RFIDIC rocker switch 156 that uses a wiping contact 134 to open and close a connection to an RFIDIC 14, antenna 24 and/or detuning lead 36 to alter a signal transmitted by the RFIDIC 14. The actuator 16 is maintained in one of three positions by a maintaining member 158 in the illustrated embodiment. In one of the positions, a wiping contact 134 connected to the actuator engages traces 138a, 138b to electrically connect them. In a second position, the actuator 16 positions the wiping contact 134 such that one or both of the traces 138*a*, 138*b* are not engaged by the wiping contact 134. As a result, a connection to the RFIDIC 14, antenna 24 and/or detuning lead 36 is open.

FIG. 17 illustrates an RFIDIC push/pull switch 160 that utilizes wiping contacts 134. The push/pull switch 160 illustrated by FIG. 17 includes two wiping contacts 134 coupled to the actuator 16. Two pairs of traces 138*a*, 138*b* are on the printed circuit board. One or two radio frequency identification integrated circuits 14 are mounted to the printed circuit board. In the exemplary embodiment, each contact 134 electrically couples a pair of traces 138*a*, 138*b* when the actuator is in one position and does not electrically couple the traces when the actuator is in another position. In the embodiment illustrated by FIG. 17, two RFIDICs 14 are mounted to the printed circuit board. Each RFIDIC 14 transmits a distinct signal.

FIG. 18 illustrates a rotary RFIDIC switch 162 that utilizes wiping contacts 134 to alter a signal provided by the RFIDIC. The illustrated rotary switch 162 utilizes a removable key 164 to rotate the actuator 16 to selected positions. In an alternate embodiment, the rotary switch 162 includes a non-removable knob (not shown) that extends from the switch housing 12 that allows the actuator to be rotated between positions.

Figure 19:
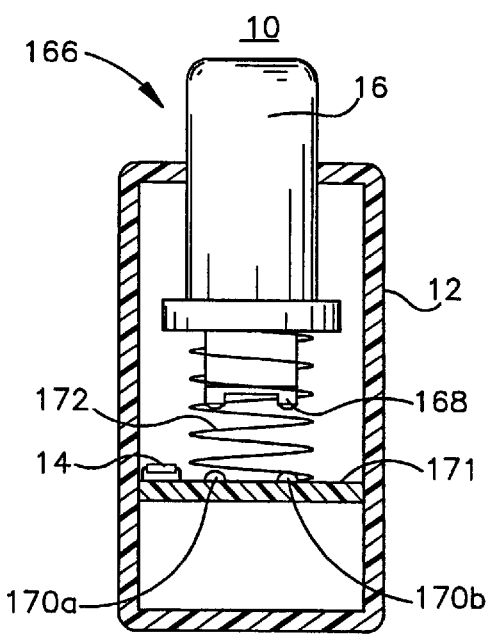
FIG. 19 is a side elevational view, partially in section, of a RFIDIC pushbutton switch.

FIG. 19 illustrates an RFIDIC switch 10 that uses a point contacts to open or close connections to an RFIDIC 14, an antenna 24 and/or detuning lead 36 to alter a signal transmitted by the RFIDIC. The switch illustrated in FIG. 19 is a push button switch 166. The switch includes a point contact 168 coupled to an actuator 16. The RFIDIC 14 is mounted to a printed circuit board 171 that is mounted in a housing 12. First and second traces 170*a*, 170*b* are defined on the printed circuit board 171. The traces 170*a*, 170*b* are electrically connected to the RFIDIC 14, antenna 24 and/or detuning lead 36, such that selective opening or shorting of traces alters a signal provided by the RFIDIC 14. The actuator 16 is biased to an extended position by a spring 172. The point contact 168 is connected to an end of the actuator 16. When the actuator is in a first position, shown in solid lines in FIG. 19, the point contact 168 does not contact traces 170*a*, 170*b* and a connection to the RFIDIC 14, antenna 24 and/or detuning lead 36 is open. When the actuator 16 is in the position illustrated in phantom, the point contact 168 contacts the first and second traces 170*a*, 170*b* to electrically bridge the contacts and close a connection to the RFIDIC 14, antenna 24 and/or detuning lead 36.

Figure 20:
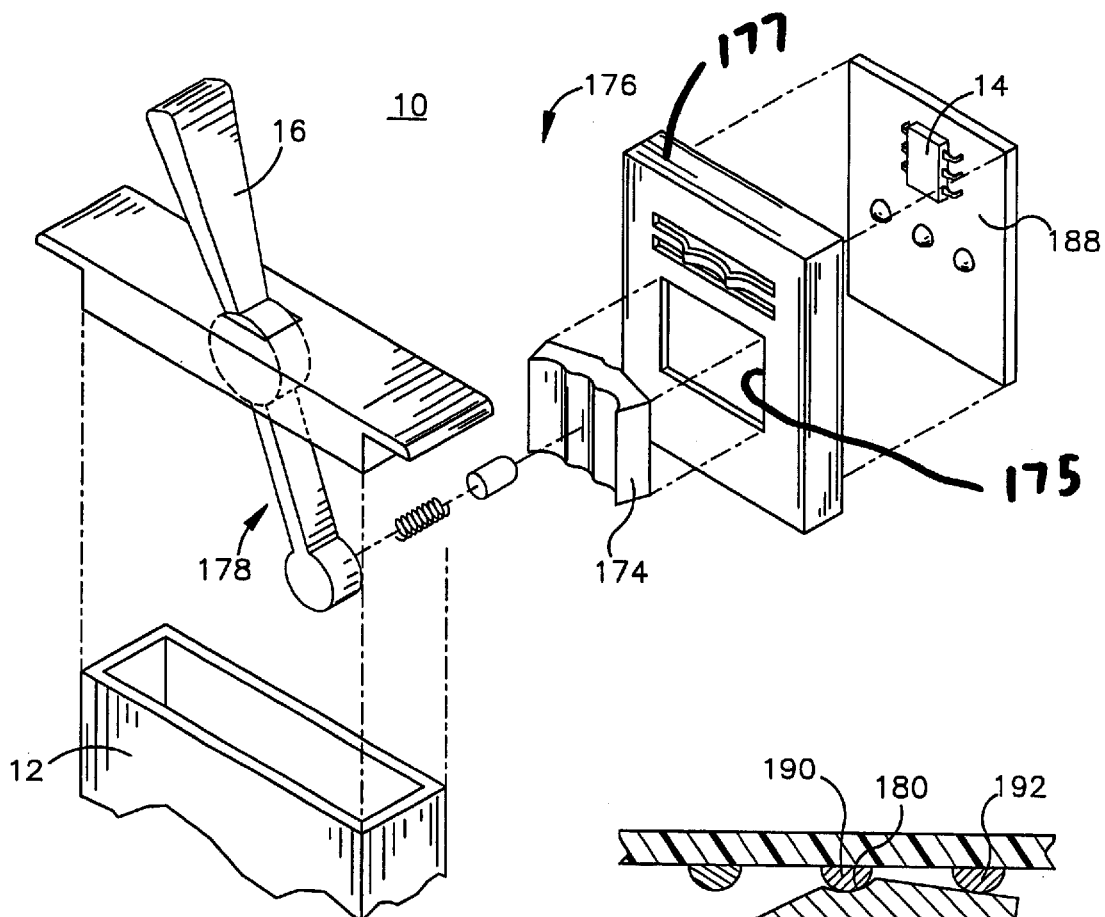
FIG. 20 is an exploded perspective view of a RFIDIC toggle switch.
Figure 21A:
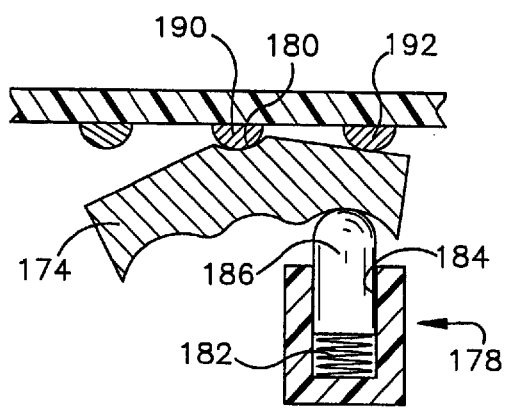
FIG. 21a is a schematic representation of a snap acting contact of the toggle switch of FIG. 20 in an actuated position.
Figure 21B:
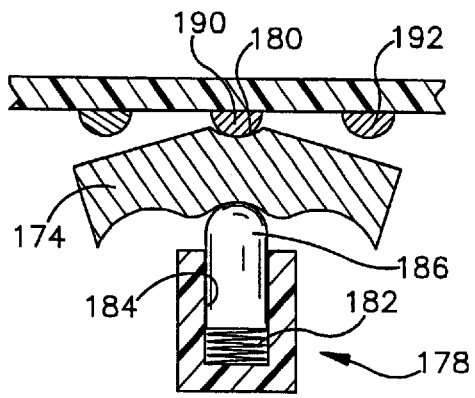
FIG. 21b is a schematic representation of a snap acting contact of the toggle switch of FIG. 20 in a normal position.

FIGS. 20, 21A and 21B illustrate an RFIDIC switch 10 that utilizes a snap acting contact 174 to open or close one or more connections to an RFIDIC 14, antenna 24 and/or detuning lead 36 to alter a signal transmitted by the RFIDIC 14. The switch illustrated in FIG. 20 is a toggle switch 176 that uses a snap acting contact 174 to open or close a connection to an RFIDIC 14, antenna 24 and/or detuning lead 36. An interior portion 178 of the actuator is coupled to the snap acting contact 174.

Referring to FIGS. 21A and 21B, the snap acting contact is rotatable about a pivot point 180 from a first position illustrated by FIG. 21B to a second position illustrated by FIG. 21A. A spring 182 is positioned in a recess 184 in the interior portion 178 of the actuator. A pressure application member 186 is constrained between the snap acting contact 174 and the recess 184 in the interior portion 178 of the actuator. The spring 182 forces the pressure application member 186 against the snap acting contact 174 to maintain the snap acting contact 174 in a selected position. In the exemplary embodiment, the spring force and the fit between the snap acting contact and the contact "bumps" on the printed circuit board help to constrain the snap acting contact. In one embodiment, a cutout 175 in a printed circuit board carrier 177 help to constrain the snap acting contact. Referring to FIG. 20, the RFIDIC 14 is mounted to a printed circuit board 188 that is mounted in the housing 12. A first trace 190 is in constant contact with the pivot point 180 of the snap acting contact 174. A second trace 192 is defined on the printed circuit board. The traces 190, 192 are electrically connected to the RFIDIC 14, antenna 24 and/or detuning lead 36, such that selective opening or shorting of the traces 190, 192 alters a signal provided by the RFIDIC 14. When the actuator 16 positions the snap acting contact 174 as depicted in FIG. 21A, the snap acting contact 174 engages the second trace 192 to electrically connect the traces 190, 192. When the actuator is positioned as shown in FIG. 21B, the snap acting contact 174 does not engage the trace 192. As a result, the first and second traces 190, 192 are disconnected to alter the signal provided by the RFIDIC 14.

In use, a radio frequency carrier signal 32 is produced by the oscillator 28 and transmitted. The RFIDIC enclosed in the switch housing 12 receives the carrier signal 32, which powers the RFIDIC. The actuator 16 is moved to one of a first position and second position to open or close a connection to the RFIDIC 14, the antenna 24 and/or detuning lead 36. The RFIDIC 14 transmits a signal 18 when the actuator is in the first position. A connection to the RFIDIC 14, antenna 24 and/or detuning lead 36 is opened or closed when the actuator is moved from the first position to a second position. The opening or closing of the connection to the RFIDIC 14, antenna 24 and/or detuning lead 36 causes the signal 18 transmitted by the RFIDIC to be altered. The signal transmitted by the RFIDIC 14 is detected by the data signal detection circuit 30, which provides an output that indicates the position of the actuator 16.

Figure 22:
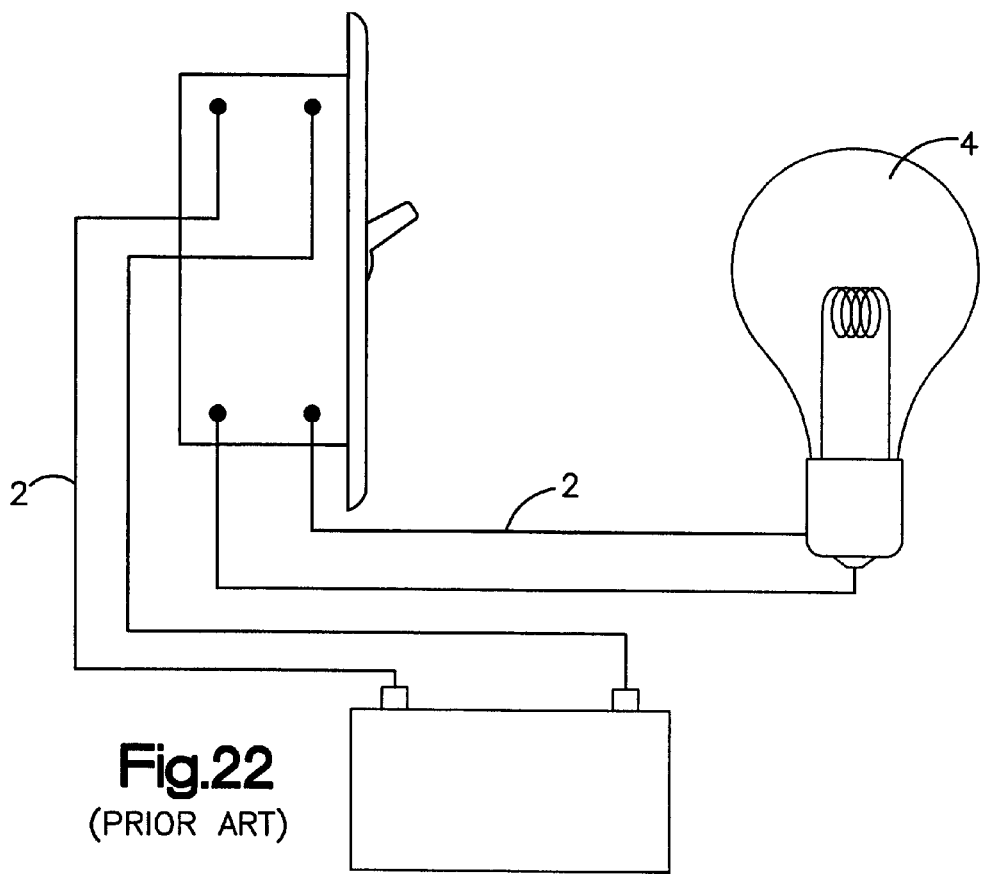
FIG. 22 is a schematic representation of a prior art illumination system.

FIG. 22 illustrates a prior art illumination system. Wires 2 are routed from a power supply 200, through a switch and to a lamp 202. Power is selectively applied to the lamp by opening or closing a connection to the power supply with a switch.

Figure 23:
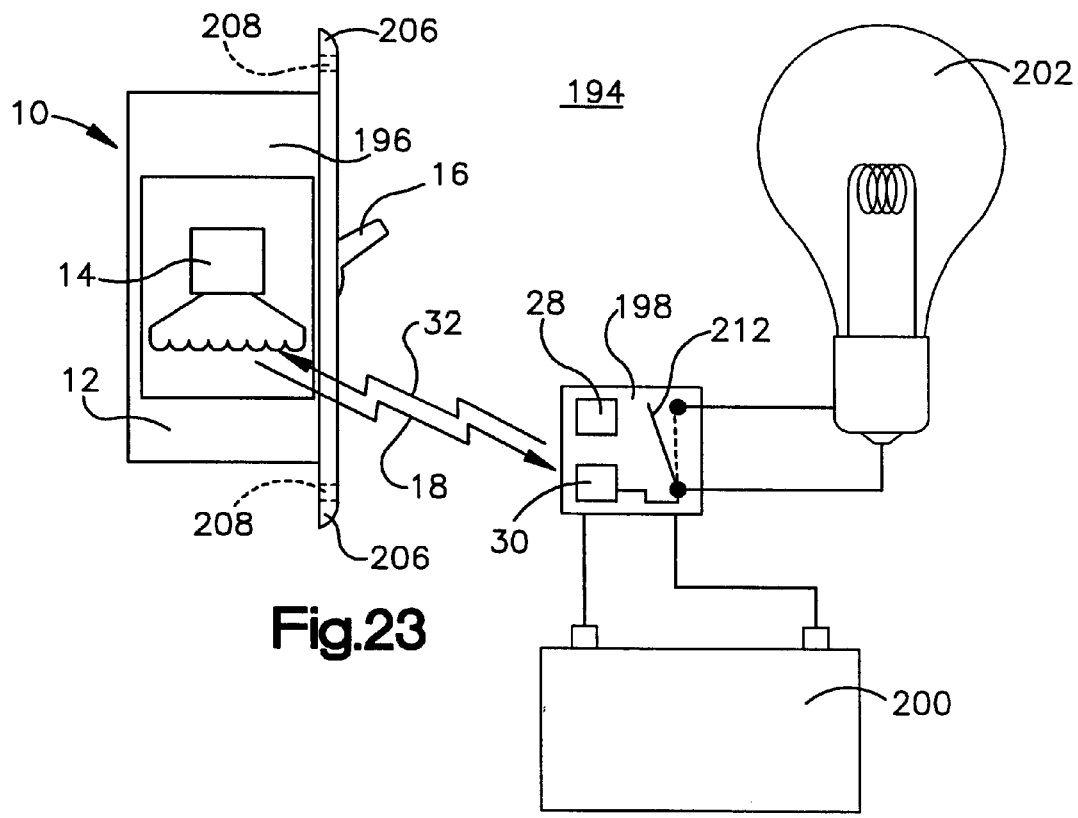
FIG. 23 is a schematic illustration of a radio frequency identification illumination system.

FIG. 23 illustrates a radio frequency identification illumination system 194. The illumination system 194 includes an RFIDIC wall switch 196, a controller 198, a power source 200 and a lamp 202. The power source could be a battery or a source of AC voltage, such as a 110 volt 60 cycle commercial power line. Mounting tabs 206 extend from the switch housing 12. The mounting tabs include mounting holes 208 that align with mounting holes for a conventional electric wall switch. The switch actuator 16 is constrained in the housing such that the actuator is movable from a first position to a second position. An RFIDIC 14 is mounted to the printed circuit board and is in communication with the actuator 16.

The controller 198 includes an oscillator 28, a data signal detection circuit 30 and a switch 212. In the exemplary embodiment, the controller is positioned close to the lamp or is included in the lamp 202 to minimize the wiring between the lamp and the controller. The power source 200 provides electrical potential to the controller 198 and also the lamp 202. The oscillator 28 provides a carrier signal 32 to the wall switch 196 that powers the RFIDIC 14. When the actuator 16 of the wall switch 196 is in a first position, the RFIDIC 14 transmits a signal 18 back to the controller 198. The data signal detection circuit 30 detects that the actuator 16 is in the first position and causes the switch to move to or remain in an open position. In this position, electric potential is not provided to the lamp 202. When the actuator 16 is moved to a second position, the signal 18 transmitted by the RFIDIC 14 is altered. The data detection circuit 30 detects the altered signal and moves the switch 212 to a closed position. Electric potential is provided from the power source 200 to the lamp 202 to illuminate the lamp. One significant advantage of the illumination system depicted in FIG. 23 is that wires are not routed to the RFIDIC switch. An additional advantage is that the RFIDIC switch does not require batteries to operate.

Although the present invention has been described with a degree of particularity, it is the intent that the invention include all modifications and alterations falling within the spirit or scope of the appended claims.

I claim:

1. A self contained radio frequency identification integrated circuit switch, comprising:
   a) a switch housing;
   b) a radio frequency powered circuit enclosed in said switch housing; and
   c) an actuator extending into said switch housing, said actuator being movable to a first position and to a second position such that said radio frequency powered circuit transmits a signal when said actuator is in one of said first and second positions and wherein movement of said actuator to the other of said first and second positions alters said signal.

2. The switch of claim 1 wherein said radio frequency powered circuit is a radio frequency identification integrated circuit.

3. The switch of claim 1 wherein said actuator alters an electrical connection between an antenna and said radio frequency powered circuit to alter said signal.

4. The switch of claim 1 wherein said actuator shorts an antenna of said radio frequency powered circuit in one of said first position and said second position to alter said signal.

5. The switch of claim 1 wherein said actuator is in communication with a detuning lead of said radio frequency powered circuit and movement of said actuator to one of said first position and said second position prevents said radio frequency powered circuit from detuning an antenna of said radio frequency powered circuit to alter said signal.

6. The switch of claim 1 wherein movement of said actuator to one of said first position and said second position causes a short across an antenna of said radio frequency powered circuit to alter said signal.

7. The switch of claim 1 wherein movement of said actuator to one of said first position and said second position opens a lead from an antenna to said radio frequency powered circuit to alter said signal.

8. The switch of claim 1 wherein movement of said actuator to one of said first position and said second position causes said radio frequency powered circuit to transmit a second signal.

9. The switch of claim 1 wherein movement of said actuator to one of said first position and said second position shields an antenna of said radio frequency powered circuit to alter said signal.

10. The switch of claim 1 further comprising a resilient dome shaped conductive contact, and first and second conductive elements mounted in said switch housing, said first and second conductive elements being electrically connected to said radio frequency powered circuit, movement of said actuator to one of said first position and said second position causes said dome shaped conductive contact to contact said first and second conductive elements to alter said signal.

11. The switch of claim 1 further comprising a magnet connected to said actuator and a reed switch mounted in said switch housing and coupled to said radio frequency powered circuit, movement of said actuator to one of said first position and said second position alters a magnetic field sensed by said reed switch to change said reed switch to an open state or a closed state to alter said signal.

12. The switch of claim 1 further comprising a magnet and a reed switch mounted in said switch housing, said reed switch being coupled to said radio frequency powered circuit, movement of said actuator to one of said first position and said second position alters a magnetic field sensed by said reed switch to change said reed switch to an open state or a closed state to alter said signal.

13. The switch of claim 1 further comprising a magnet connected to said actuator and a hall sensor mounted in said switch housing and coupled to said radio frequency powered circuit, movement of said actuator to one of said first position and said second position alters a magnetic field sensed by said hall sensor to alter an output from said hall sensor to said radio frequency powered circuit to alter said signal.

14. The switch of claim 1 further comprising a magnet and a hall sensor mounted in said switch housing, said hall sensor being coupled to said radio frequency powered circuit, movement of said actuator to one of said first position and said second position alters a magnetic field sensed by said hall sensor to alter an output from said hall sensor to said radio frequency powered circuit to alter said signal.

15. The switch of claim 1 further comprising a contact coupled to said actuator and a conductive element in said switch housing that is electrically connected to said radio frequency powered circuit, movement of said actuator to one of said first position and said second position brings said contact into engagement with said conductive element to alter said signal.

16. The switch of claim 1 further comprising a wiper contact coupled to said actuator and first and second conductive elements in said switch housing that are electrically connected to said radio frequency powered circuit, movement of said actuator to one of said first position and said second position brings said wiper contact into engagement with said conductive elements to alter said signal.

17. The switch of claim 1 further comprising a point contact coupled to said actuator and a conductive element in said switch housing that is electrically connected to said radio frequency powered circuit, movement of said actuator to one of said first position and said second position brings said point contact into engagement with said conductive element to alter said signal.

18. A method of transmitting a signal that indicates a position of an actuator of a radio frequency powered switch, comprising:
   a) enclosing a radio frequency powered circuit in a housing of a switch having an actuator that is movable to a first position and to a second position;
   b) moving said actuator to one of said first position and said second position,
   c) transmitting a signal with said radio frequency powered circuit;
   d) moving said actuator to the other of said first position and said second position to alter said signal.

19. The method of claim 18 wherein said radio frequency powered circuit is a radio frequency identification integrated circuit.

20. The method of claim 18 wherein said signal is altered by altering an electrical connection between an antenna and said radio frequency powered circuit.

21. The method of claim 18 wherein said signal is altered by shorting an antenna of said radio frequency powered circuit.

22. The method of claim 18 wherein said signal is altered by preventing said radio powered circuit from detuning an antenna of said radio frequency powered circuit.

23. The method of claim 18 wherein said signal is altered by opening a lead from an antenna to said radio frequency powered circuit.

24. The method of claim 18 wherein moving of said actuator to one of said first position and said second position causes said radio frequency powered circuit to transmit a second signal.

25. The method of claim 18 wherein said signal is altered by shielding an antenna of said radio frequency powered circuit.

26. The method of claim 18 further comprising enclosing a resilient dome shaped conductive contact, and first and second conductive elements in said switch housing, and electrically connecting said first and second conductive elements to said radio powered circuit, said resilient dome shaped contact being positioned such that moving said actuator to one of said first position and said second position causes said dome shaped conductive contact to contact said first and second conductive elements to alter said signal.

27. The method of claim 18 further comprising moving said actuator to one of said first position and said second position to alter a magnetic field sensed by a reed switch mounted in said switch housing to change said reed switch to an open state or a closed state to alter said signal.

28. The method of claim 18 further comprising moving said actuator to one of said first position and said second position to alter a magnetic field sensed by a hall sensor mounted in said switch housing to alter an output from said hall sensor to said radio frequency powered circuit to alter said signal.

29. The method of claim 18 further comprising coupling a contact to said actuator, mounting a conductive element in said switch housing, and electrically connecting said conductive element to said radio frequency powered circuit, wherein moving said actuator to one of said first position and said second position brings said contact into engagement with said conductive element to alter said signal.

30. The method of claim 18 further comprising coupling a wiper contact to said actuator, mounting first and second conductive elements in said switch housing, and electrically connecting said conductive elements to said radio frequency powered circuit, wherein moving said actuator to one of said first position and said second position brings said wiper contact into engagement with said conductive elements to alter said signal.

31. The method of claim 18 further comprising coupling a point contact to said actuator, mounting a conductive element in said switch housing, and electrically connecting said conductive element to said radio frequency powered circuit, wherein moving said actuator to one of said first position and said second position brings said point contact into engagement with said conductive element to alter said signal.

32. A radio frequency identification control system, comprising:
a) an oscillator for producing a radio frequency carrier signal;
b) a self contained radio frequency identification integrated circuit switch that receives and is powered by said carrier signal, said switch includes;
   i) a switch housing;
   ii) a radio frequency identification integrated circuit enclosed in said switch housing;
   iii) an actuator extending into said switch housing, said actuator being movable to a first position and to a second position such that said radio frequency identification integrated circuit transmits a data signal when said actuator is in one of said first and second positions and wherein movement of said actuator to the other of said first and second positions alters said data signal; and
c) a data signal detection circuit that detects said data signal transmitted by said radio frequency identification integrated circuit and provides an output that is indicative of the position said switch actuator.

33. The control system of claim 32 wherein said actuator alters an electrical connection between an antenna and said radio frequency identification integrated circuit in one of said first position and said second position to alter said data signal.

34. The control system of claim 32 wherein movement of said actuator to one of said first position and said second position causes said radio frequency identification integrated circuit to transmit a second data signal.

35. The control system of claim 32 wherein movement of said actuator to one of said first position and said second position shields an antenna of said radio frequency identification integrated circuit to alter said data signal.

36. The control system of claim 32 further comprising a contact coupled to said actuator and a conductive element in said switch housing that is electrically connected to said radio frequency identification integrated circuit, movement of said actuator to one of said first position and said second position brings said contact into engagement with said conductive element to alter said data signal.

37. A method of detecting the position of an actuator of a radio frequency identification integrated circuit switch, comprising:
a) producing a radio frequency carrier signal;
b) receiving said carrier signal to power a radio frequency identification integrated circuit that is enclosed in a switch housing having an actuator that is movable to a first position and to a second position;
c) moving said actuator to one of said first position and said second position,
d) transmitting a data signal with said radio frequency identification integrated circuit;
e) moving said actuator to the other of said first position and said second position to alter said data signal;
f) receiving said data signal with a data signal detection circuit; and
g) providing an indication of the position of said actuator with said data signal detection circuit.

38. The method of claim 37 wherein said data signal is altered by altering an electrical connection between an antenna and said radio frequency identification integrated circuit.

39. The method of claim 37 wherein moving of said actuator to one of said first position and said second position causes said radio frequency identification integrated circuit to transmit a second data signal.

40. The method of claim 37 wherein said data signal is altered by shielding an antenna of said radio frequency identification integrated circuit.

41. The method of claim 37 further comprising coupling a contact to said actuator, mounting a conductive element in said switch housing, and electrically connecting said conductive element to said radio frequency identification integrated circuit, wherein moving said actuator to one of said first position and said second position brings said contact into engagement with said conductive element to alter said data signal.

42. A self contained radio frequency identification integrated circuit pushbutton switch, comprising:
   a) a switch housing;
   b) a switch actuator that extends through a wall of said switch housing, said switch actuator being movable to an extended position and to a depressed position;
   c) a spring in communication with said actuator that biases said actuator to said extended position;
   d) a printed circuit mounted in said switch housing;
   e) first and second conductive surfaces on said printed circuit;
   f) a radio frequency identification integrated circuit mounted to said printed circuit and electrically connected to said first and second conductive surfaces;
   g) a contact coupled to said actuator that shorts said first and second conductive surfaces in one of said extended position and said depressed position to alter a signal transmitted by said radio frequency identification integrated circuit.

43. A self contained radio frequency identification integrated circuit switch, comprising:
   a) a switch housing;
   b) a switch actuator that extends through a wall of said switch housing, said switch actuator being movable to an extended position and to a depressed position;
   c) a spring in communication with said actuator that biases said actuator to said extended position;
   d) a printed circuit mounted in said switch housing;
   e) a radio frequency identification integrated circuit mounted to said printed circuit, said radio frequency identification integrated circuit transmits a signal when said actuator is in one of said extended position and said depressed position and wherein movement of said actuator to the other of the extended position and the depressed position alters said signal.

44. The switch of claim 43 further comprising one or more conductive surfaces on said printed circuit board that are electrically connected to an antenna of said radio frequency identification integrated circuit and a contact coupled to said actuator, wherein said contact engages one or more of said conductive surfaces to alter said signal.

45. The switch of claim 43 further comprising a shield connected to said actuator, wherein movement of said actuator to one of said extended position and said depressed position shields an antenna of said radio frequency identification integrated circuit to alter said signal.

46. A self contained radio frequency identification integrated circuit slide switch, comprising:
   a) a switch housing;
   b) a switch actuator that extends through a face of said switch housing, said switch actuator being constrained by said switch housing such that said actuator is movable from a first position along a linear path to a second position;
   c) a printed circuit mounted in said switch housing;
   d) a radio frequency identification integrated circuit mounted to said printed circuit, said radio frequency identification integrated circuit transmits a signal when said actuator is in one of said first position and said second position and wherein movement of said actuator to the other of the first position and the second position alters said signal.

47. A self contained radio frequency identification integrated circuit rotary switch, comprising:
   a) a switch housing;
   b) a rotary actuator that extends into said switch housing and is rotatable from a first position to a second position;
   c) a printed circuit mounted in said switch housing;
   d) a radio frequency identification integrated circuit mounted to said printed circuit, said radio frequency identification integrated circuit transmits a signal when said rotary actuator is in one of said first position and said second position and wherein rotation of said rotary actuator to the other of the first position and the second position alters said signal.

48. The switch of claim 47 further comprising one or more conductive surfaces on said printed circuit board that are electrically connected to an antenna of said radio frequency identification integrated circuit and a contact connected to said rotary actuator, wherein said contact engages one or more of said conductive surfaces to alter said signal.

49. The switch of claim 47 further comprising a shield coupled to actuator, wherein movement of said rotary actuator to one of said first position and said second position shields an antenna of said radio frequency identification integrated circuit to alter said signal.

50. The switch of claim 47 further comprising a contact coupled to said actuator and first and second conductive surfaces on said printed circuit electrically connected to said radio frequency identification integrated circuit, movement of said actuator to one of said first position and said second position brings said contact into engagement with said conductive surfaces to alter said signal.

51. The switch of claim 47 wherein said rotary actuator accepts a key and rotation of said key rotates said rotary actuator.

52. A self contained radio frequency identification integrated circuit rotary switch, comprising:
   a) a switch housing;
   b) a rotary actuator that extends into said switch housing, said actuator being rotatable to a first position and to a second position;
   c) a printed circuit mounted in said switch housing;
   d) first and second conductive surfaces on said printed circuit;
   e) a radio frequency identification integrated circuit mounted to said printed circuit and electrically connected to said first and second conductive surfaces; and
   f) a contact coupled to said rotary actuator that shorts said first and second conductive surfaces when said actuator is in one of said first position and said second position to alter a signal transmitted by said radio frequency identification integrated circuit.

53. The switch of claim 52 wherein said rotary actuator includes an opening that accepts a key that is used to rotate said rotary actuator.

54. The switch of claim 52 further comprising a knob connected to said rotary actuator for rotating said rotary actuator.

55. A self contained radio frequency identification integrated circuit push/pull switch, comprising:

a) a switch housing;
b) a switch actuator that extends into a switch housing, said switch actuator being movable to an extended position and to a depressed position;
c) a printed circuit mounted in said switch housing;
d) first and second conductive surfaces on said printed circuit;
e) a radio frequency identification integrated circuit mounted to said printed circuit and electrically connected to said first and second conductive surfaces; and
f) a contact coupled to said actuator that shorts said first and second conductive surfaces in one of said extended position and said depressed position to alter a signal transmitted by said radio frequency identification integrated circuit.

56. The switch of claim 55 wherein said contact is a wiper contact.

57. A self contained radio frequency identification integrated circuit switch, comprising:
a) a switch housing;
b) a switch actuator that extends into switch housing, said switch actuator being movable to an extended position and to a depressed position;
c) a printed circuit mounted in said switch housing; and
d) a radio frequency identification integrated circuit mounted to said printed circuit, said radio frequency identification integrated circuit transmits a signal when said actuator is in one of said extended position and said depressed position and wherein movement of said actuator to the other of the extended position and the depressed position alters said signal.

58. The switch of claim 57 further comprising first and second conductive surfaces on said printed circuit board that are electrically connected to an antenna of said radio frequency identification integrated circuit and a contact coupled to said actuator, wherein said contact engages said first and second conductive surfaces to alter said signal.

59. The switch of claim 57 further comprising a shield connected to said actuator, wherein movement of said actuator to one of said extended position and said depressed position shields an antenna of said radio frequency identification integrated circuit to alter said signal.

60. A self contained radio frequency identification integrated circuit switch, comprising:
a) a switch housing;
b) an actuator pivotally connected to said switch housing such that said actuator can rotate to a first position and to a second position, said actuator including an elongated portion that extends into said housing;
c) a printed circuit mounted in said switch housing; and
d) a radio frequency identification integrated circuit mounted to said printed circuit, said radio frequency identification integrated circuit transmits a signal when said rocker actuator is in one of said first position and said second position and wherein movement of said actuator to the other of the first position and the second position alters said signal.

61. The switch of claim 60 wherein said actuator is a rocker actuator.

62. The switch of claim 60 wherein said actuator is a toggle actuator.

63. The switch of claim 60 further comprising a retainer mounted in said switch housing that maintains said actuator in said first position when said rocker actuator is moved to said first position and maintains said actuator in said second position when said rocker is moved to said second position.

64. The switch of claim 60 further comprising a printed circuit board having first and second conductive surfaces that are electrically connected to said radio frequency identification integrated circuit mounted in said housing and a contact mounted in said housing having a pivot point in contact with said first conductive surface, wherein movement of said actuator to one of said first position and said second position pivots said contact into engagement with said second conductive surface to alter said signal.

65. The switch of claim 60 further comprising first and second conductive surfaces on said printed circuit board that are electrically connected to an antenna of said radio frequency identification integrated circuit and a contact coupled to said elongated portion, wherein said contact engages said first and second conductive surfaces to alter said signal.

66. The switch of claim 60 further comprising a contact connected to said elongated portion and first and second conductive surfaces on said printed circuit board electrically connected to said radio frequency identification integrated circuit, movement of said actuator to one of said first position and said second position brings said wiper contact into engagement with said conductive surfaces to alter said signal.

67. The switch of claim 66 further comprising a snap acting contact coupled to said actuator and a conductive element in said switch housing that is electrically connected to said radio frequency identification integrated circuit, movement of said actuator to one of said first position and said second position brings said snap acting contact into engagement with said conductive element to alter said signal.

68. A self contained radio frequency identification integrated circuit wall switch, comprising:
a) a switch housing including mounting tabs that include mounting openings that align with mounting holes for a conventional electrical wall switch;
b) a switch actuator constrained by said switch housing such that said actuator is movable from a first position to a second position;
c) a printed circuit mounted in said switch housing; and
d) a radio frequency identification integrated circuit mounted to said printed circuit and in communication with said actuator such that said radio frequency identification integrated circuit transmits a signal when said actuator is in one of said first position and said second position and wherein movement of said actuator to the other of the first position and the second position alters said signal.

69. In an illumination system for a building that includes a power source that is selectively electrically connected to a lamp by actuation of a switch wherein the improvement comprises:
a) a controller that is electrically connected to said power source and said lamp, said controller including an oscillator that produces a radio frequency carrier signal;
b) a self contained radio frequency identification integrated circuit switch spaced apart and electrically isolated from said controller that receives and is powered by said carrier signal, said radio frequency identification integrated circuit switch includes;
  i) a switch housing;
  ii) a radio frequency identification integrated circuit enclosed in said switch housing;
  iii) an actuator extending into said switch housing, said actuator being movable to a first position and to a second position such that said radio frequency identification integrated circuit transmits a data signal when said actuator is in one of said first and second positions and wherein movement of said actuator to the other of said first and second positions alters said data signal, said controller detects said data signal transmitted by said radio frequency identification integrated circuit and selectively applies power to said lamp in response to a detected position of said switch actuator.

* * * * *